United States Patent
Choi et al.

(10) Patent No.: US 7,538,342 B2
(45) Date of Patent: May 26, 2009

(54) FLAT PANEL DISPLAY AND METHOD FOR FABRICATING THE SAME

(75) Inventors: Tae-young Choi, Seoul (KR); Bo-sung Kim, Seoul (KR); Keun-kyu Song, Gyeonggi-do (KR); Mun-pyo Hong, Gyeonggi-do (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 81 days.

(21) Appl. No.: 11/487,234

(22) Filed: Jul. 14, 2006

(65) Prior Publication Data

US 2007/0012920 A1    Jan. 18, 2007

(30) Foreign Application Priority Data

Jul. 14, 2005    (KR) ..................... 10-2005-0063927

(51) Int. Cl.
  *H01L 29/08* (2006.01)
(52) U.S. Cl. .................. 257/40; 257/72; 257/E27.131; 257/59; 349/43; 349/128
(58) Field of Classification Search .................. 257/59, 257/72, E27.131, 40; 438/149; 349/43
  See application file for complete search history.

(56) References Cited

U.S. PATENT DOCUMENTS

| | | | |
|---|---|---|---|
| 6,674,495 B1 * | 1/2004 | Hong et al. | .................... 349/43 |
| 6,713,785 B2 | 3/2004 | Yagi | |
| 6,849,870 B2 | 2/2005 | Koo et al. | |
| 6,869,821 B2 | 3/2005 | Knipp et al. | |
| 7,173,372 B2 * | 2/2007 | Koo et al. | .................... 313/505 |
| 2003/0111663 A1 * | 6/2003 | Yagi | ............................ 257/59 |
| 2004/0065929 A1 | 4/2004 | Koo et al. | |
| 2004/0124416 A1 * | 7/2004 | Knipp et al. | .................. 257/72 |
| 2005/0078242 A1 | 4/2005 | Park et al. | |
| 2006/0044487 A1 * | 3/2006 | Okada et al. | .................. 349/46 |

FOREIGN PATENT DOCUMENTS

| | | |
|---|---|---|
| CN | 1195243 C | 3/2005 |
| JP | 05-226475 | 9/1993 |
| JP | 10-161140 | 6/1998 |
| JP | 10-319431 | 12/1998 |

(Continued)

OTHER PUBLICATIONS

Patent Abstracts of Japan, Publication No. 11-307778, Nov. 5, 1999, 1 p.

(Continued)

*Primary Examiner*—Evan Pert
*Assistant Examiner*—Selim Ahmed
(74) *Attorney, Agent, or Firm*—Haynes and Boone, LLP

(57) ABSTRACT

The invention provides a flat panel display having an insulating substrate; a data line formed on the insulating substrate; an interlayer insulating film formed on the data line having a first contact opening exposing the data line; a connecting member formed in a part of the first contact opening; an interlayer insulating film around the first contact opening; a gate insulating film formed on the connecting member having a second contact opening exposing the connecting member; and an organic semiconductor layer formed on the gate insulating film.

13 Claims, 23 Drawing Sheets

FOREIGN PATENT DOCUMENTS

| | | |
|---|---|---|
| JP | 11-307778 | 11/1999 |
| JP | 2003-309265 | 10/2003 |
| JP | 2005-64496 | 3/2005 |
| JP | 2006-071946 | 3/2006 |
| KR | 10-2004-0049110 | 6/2004 |

OTHER PUBLICATIONS

Patent Abstracts of Japan, Publication No. 2005-064496, Mar. 10, 2005, 1 p.

Korean Patent Abstracts, Publication No. 1020040049110, Jun. 11, 2004, 1 p.

\* cited by examiner

FLAT PANEL DISPLAY AND METHOD FOR FABRICATING THE SAME

CROSS-REFERENCE TO RELATED APPLICATIONS

This application claims the benefit of Korean Patent Application No. 2005-0063927, filed on Jul. 14, 2005, in the Korean Intellectual Property Office, the disclosure of which is incorporated by reference herein in its entirety.

FIELD OF THE INVENTION

The present invention relates to a flat panel display and a method for fabricating the same and, more particularly, to a flat panel display and a method for fabricating the same which provide an improved contact structure between a data line and a transparent electrode layer.

DESCRIPTION OF THE RELATED ART

A flat panel display (FPD) includes a thin film transistor (TFT) substrate having a TFT as a switching and driving device for controlling and driving the operation of each pixel. The substrate includes a gate pad and a data pad which receive external driving or controlling signals. The TFT includes a gate electrode, a drain electrode, a source electrode and a semiconductor layer formed of amorphous silicon or polysilicon. However, organic semiconductors have recently become available. Since an organic semiconductor can be formed at room temperature and atmospheric pressure, fabricating costs are reduced and plastic substrates can be used that could not be used with inorganic semiconductors because of the poor heat resistance of plastic. However, the organic semiconductor has a disadvantage in that it has poor resistance to chemicals and plasma.

In order to solve this problem, it has been proposed to provide a Process Architecture (PA) in which the organic semiconductor layer is finally formed after the gate electrode, source electrode and the drain electrodes are formed. A gate insulating film which is a thick organic film is interposed between the electrodes and the organic semiconductor layer. A data line (including a data line and the data pad) is formed, and then an interlayer insulating film is formed on the data line so as to protect the gate insulating film from chemicals used in a forming process of the data line. A contact opening is formed to connect the transparent electrode layer with the data line by etching a thickness from the gate insulating film to the data line. Another contact opening is formed to connect the transparent electrode layer with the gate pad by etching a thickness from the gate pad to the gate insulating film. However, a problem of etching uniformity arises because the thickness of the data line is different from that of the gate pad. Particularly, when the gate insulating film is formed of a thick organic film, a contact failure can occur between the data line and the transparent electrode layer because of insufficient etching margin. Further, depending on the etching condition, a failure on the gate pad can occur because of overetching.

SUMMARY OF THE INVENTION

The present invention provides a flat panel display having an improved contact structure between a data line and a transparent electrode layer and a method for fabricating the same. The flat panel display comprises: an insulating substrate; a data line formed on the insulating substrate; an interlayer insulating film is formed on the data line having a first contact opening exposing the data line; a connecting member formed in a part of the first contact opening; a gate insulating film is formed on the connecting member having a second contact opening exposing the connecting member; and an organic semiconductor layer is formed on the gate insulating film.

According to an aspect of the present invention, the gate electrode is formed on the same layer with the connecting member, and is located in a lower part of the organic semiconductor layer. A third contact opening to expose the gate pad is formed on the gate insulating film provided on the gate pad. The transparent electrode layer further comprises a gate pad contact part connected to the gate pad through the third contact opening. According to an aspect of the present invention, the transparent electrode layer is composed of one of ITO (Indium Tin Oxide) and IZO (Indium Zinc Oxide). A passivation layer is formed on the organic semiconductor layer. The thickness of the gate insulating film on which the second contact opening is formed is substantially the same as the thickness of the gate insulating film on which the third contact opening is formed.

The foregoing and other objects are substantially realized by providing a method for fabricating a flat panel display comprising: providing an insulating substrate; forming a data line on the insulating substrate; forming an interlayer insulating film on the data line having a first opening exposing the data line; forming a connecting member having different stepped portions in the first contact opening; forming a gate insulating film on the connecting member; forming an organic semiconductor layer on the gate insulating film and forming a passivation layer on the organic semiconductor layer. According to an aspect of the present invention, a transparent electrode layer is connected to the connecting member through a second contact opening.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION

Figure 1:
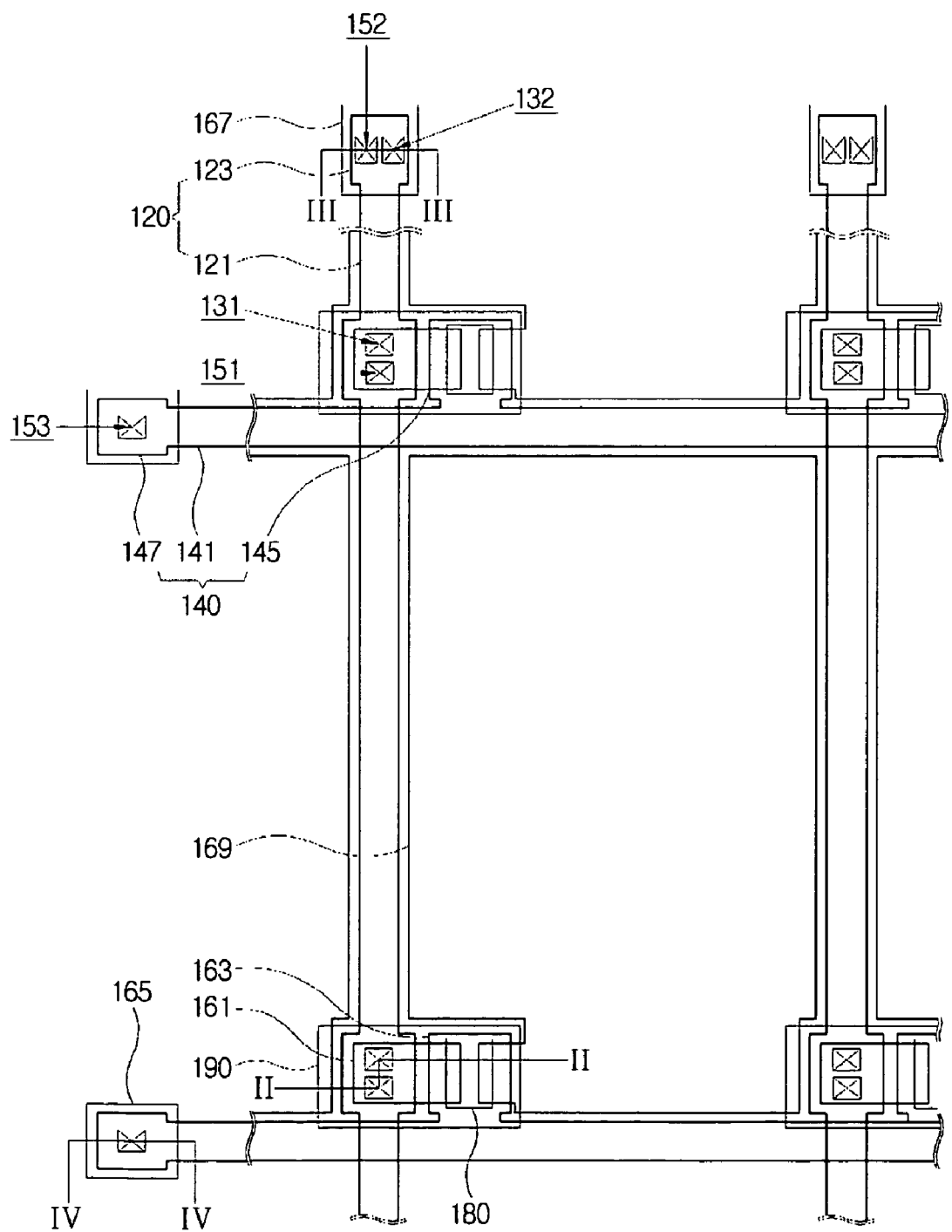
FIG. 1 is a plot plan view of a TFT substrate according to a first embodiment of the present invention.

Reference will now be made to the embodiments of the present invention, examples of which are illustrated in the accompanying drawings, wherein like reference numerals refer to like elements throughout. It will be understood that when an element such as a film (layer) is referred to as being formed (located) "on" another element, it can be directly laid on the other element or intervening elements may also be present.

Figure 2:
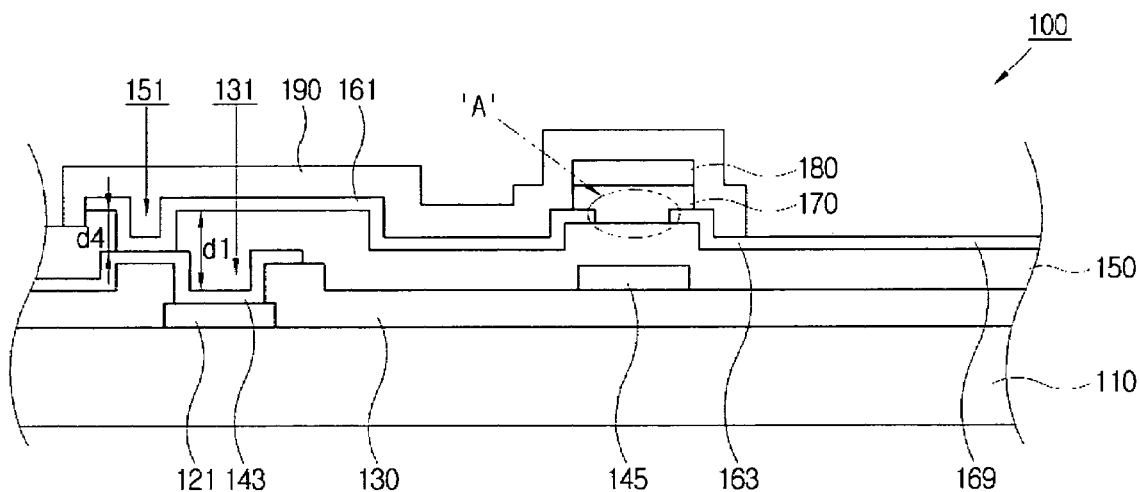
FIG. 2 is a cross-sectional view taken along line II-II of FIG. 1.
Figure 3:
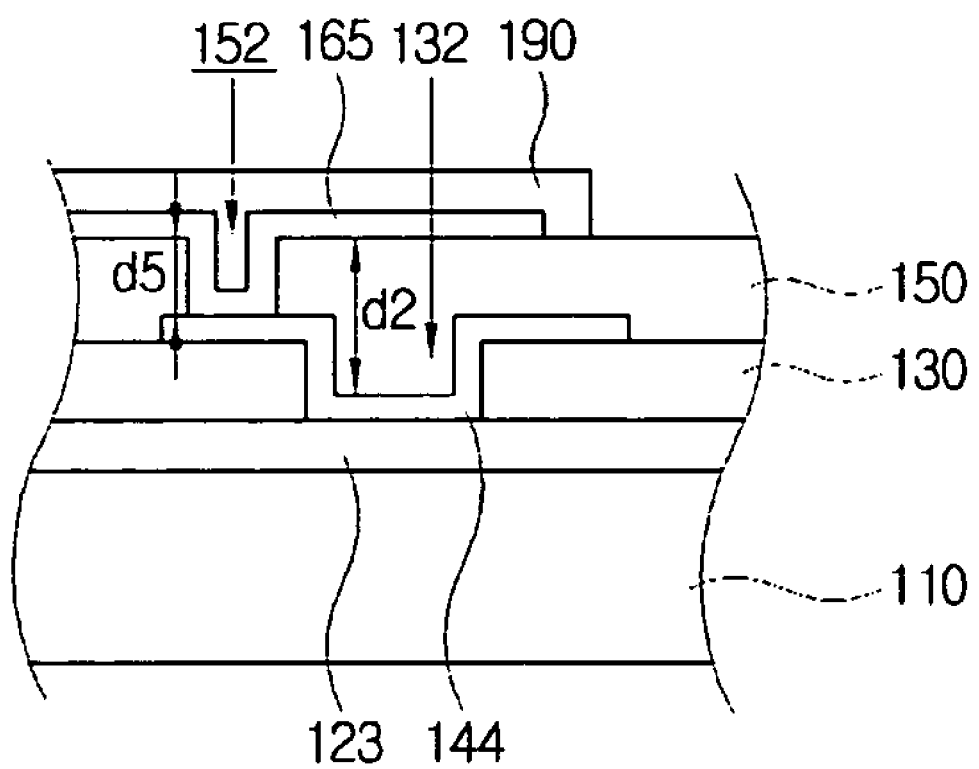
FIG. 3 is a cross-sectional view taken along line III-III of FIG. 1.
Figure 4:
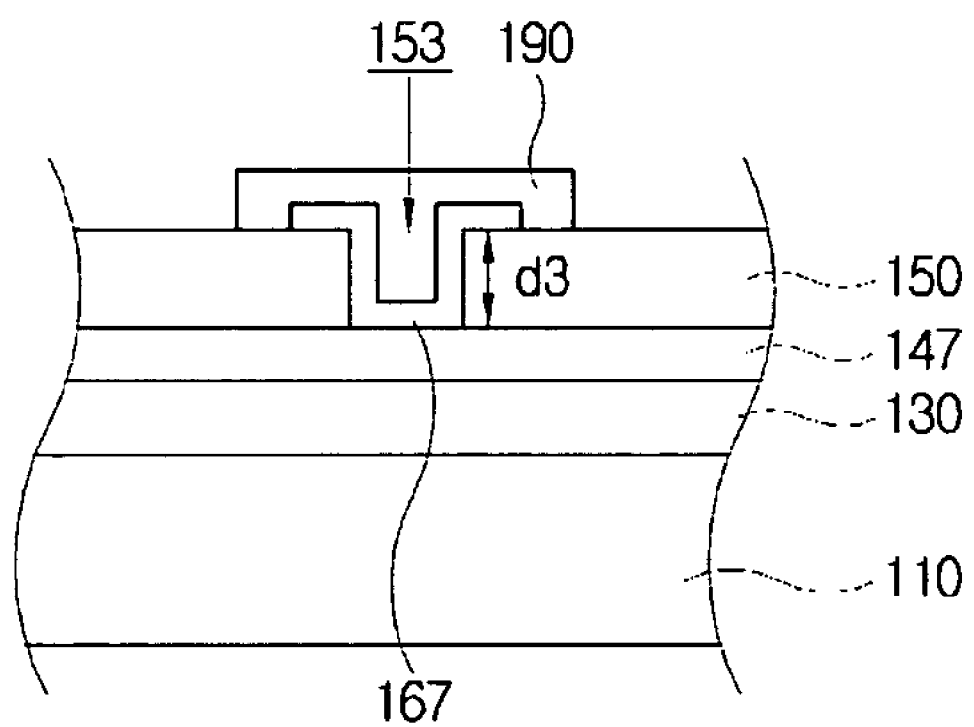
FIG. 4 is a cross-sectional view taken along IV-IV of FIG. 1.

Referring to FIGS. 2-4, the flat panel display (FPD) of the present invention includes a TFT substrate 100 having a TFT as a switching and driving device for controlling and driving each pixel. TFT substrate 100 includes a gate pad 147, FIG. 4, and a data pad 123 which receive externally supplied driving or controlling signals.

Insulating substrate 110 includes on its surface a data line 120 having component parts 121 and 123, an interlayer insulating film 130 formed on the data line 120, a gate line 140 having component part 141, 145 and 147 formed on the interlayer insulating film 130, a gate insulating film 150 formed on the gate line 140, a transparent electrode layer 160 formed on the gate insulating film 150, and an organic semiconductor layer 170 formed on the gate insulating film 150.

Insulating substrate 110 may be made of glass or, to provide a flexible display, can be made of a plastic material such as polycarbon, polyimide, poly ether sulfone, polyacrylate, poly ethylene, poly ethylene naphthalate, poly ethylene terephthalate, etc. While a plastic insulation substrate would exhibit poor heat resistance to the temperatures used in forming inorganic semiconductor and oxide layers. It would be compatible with an organic semiconductor layer 170 that can be formed at room temperature and atmospheric pressure.

Data line 120, formed on insulating substrate 110, includes a data line 121 extending in one direction and a data pad 123 having for receiving an externally supplied driving or controlling signal. Data line 120 may be made of a relatively low price, good conductivity material such as Al, Cr and Mo or of Au, Pt, Pd, ITO (Indium Tin Oxide) and IZO (Indium Zinc Oxide) which have a relatively high price. Data line 120 may have a single layer or a plurality of layers containing at least one of the above-mentioned materials.

According to the present invention, in order to protect the gate insulating film 150 from chemicals used in forming the data line, interlayer insulating film 130 is formed on and covers data line 120. Interlayer insulating film 130 is formed of an inorganic material such as $SiN_x$ or $SiO_x$, etc., so as to electrically insulate data line 120 from the gate line 140. Although not shown in the drawing, the interlayer insulating film 130 may also include a film of an organic material deposited on the inorganic layer. This additional thick organic film further protects the organic semiconductor layer 170 against the chemicals or plasma used in the data line forming process that may flow into the organic semiconductor layer 170 through the gap of a contact opening 131, 151 to be described below or through an interface between the layers.

Interlayer insulating film 130 is formed with first contact openings 131 and 132 to expose data line 120. In other words, as shown in FIG. 2, interlayer insulating film 130 is formed with a first openings 131, and as shown in FIG. 3 with an opening 132 to respectively expose the data line 121 and the data pad 123. Gate line 145 is formed on interlayer insulating film 130. Gate line 140, as indicated in FIG. 1, includes a gate line 141 formed to intersect with the data line 121 and define a pixel area. Gate pad 147, formed at an end of the gate line 141, is for receiving an external driving or controlling signal. Gate electrode 145 is formed as a branch of the gate line 141 at a place corresponding to the organic semiconductor layer 170. Connecting members 143, 144 are formed in a part of the first contact openings 131, 132. Interlayer insulating film 130 is formed around first contact openings 131, 132. Gate line 140 may also contain at least one of Al, Cr, Mo, Au, Pt, Pd, etc., and have a single layer or a plurality of layers.

Gate insulating film 150 is formed on gate line 140 and is made of a thick organic film such as BCB (Benzocyclobutene), etc., to protect organic semiconductor layer 170 against chemical attack. Gate insulating film 150 may be a double layer made of an organic film and inorganic film, wherein the inorganic film is made of $SiN_x$.

Second contact openings 151 (best seen in FIG. 8), and 152 (best seen in FIGS. 6E and 6F) are formed in gate insulating film 150 to expose connecting members 143 (best seen in FIG. 5E) and 144 (best seen in FIG. 6F) and a third contact opening 153 (best seen in FIGS. 4, 7D and 7E) exposes gate pad 147.

As shown in FIG. 2, the connecting member 143 located on the data line 121 has a stepped portion owing to a stepped portion of the data line 121. The second-contact opening 151 is positioned over a higher portion of connecting member 143. As shown in FIG. 3, the second contact opening 152 for connecting the data pad 123 is formed to expose the connecting member 143 covering the interlayer insulating film 140.

In traditional method, however, the second contact openings 151, 152 are formed on an area corresponding to the first contact openings 131, 132. Accordingly, the thickness $d_1$ from the gate insulating film 150 to the data line 121 shown in FIG. 2 and the thickness $d_2$ from the gate insulating film 150 to the data pad 123 shown in FIG. 3 have to be etched so that the data line 121 and the data pad 123 have to be exposed.

In particular, if a thick gate insulating film 150 is used to protect organic semiconductor layer 170, there may be insufficient etching margin, resulting in poor contact between the transparent electrode layer 160 and the data line 120. Also, the second contact openings 151, 152 and the third contact opening 153 are formed simultaneously by the same etching process.

In accordance with the invention, only a thickness $d_3$ (FIG. 4) is etched from gate insulating film 150 is etched to form the third contact opening 153 exposing the gate pad 147. Then thicknesses $d_1$ (FIG. 2) and $d_2$ (FIG. 3) are etched from gate insulating film 150 to form the second contact openings 151, 152, respectively.

In other words, if etching uniformity is not so good, thicknesses $d_1$, $d_2$ toward data line 120 and a thickness $d_3$ toward the gate pad 147 may be different, particularly when the etching margin is insufficient owing to organic gate insulating film 150 being thick. This will result in a poor contact between the data line 120 and the transparent electrode layer 160. Also, gate pad 147 may be adversely affected if the etching process is exceeded.

Therefore, according to the present invention, the second contact openings 151, 152 are not formed on the areas corresponding the first contact openings 131, 132 (FIGS. 2 and 3). Instead, the second contact openings 151, 152 are formed on the gate insulating film 150 where the thicknesses $d_4$, $d_5$ of the gate insulating film 150 are substantially equal to the thickness $d_3$ of the gate insulating film 150 at the third contact opening 153. In other words, the second contact openings 151, 152 are formed near the first contact openings 131, 132 to form a step shape with each other in a cross-sectional view. Accordingly, the problem of non-uniform etching is avoided as the etching depths $d_4$, $d_5$ at the data line 120 are substantially equal to the thickness $d_3$ at the data pad 147.

In particular, the etching margins at data pad 147 and data line 120 are similar even though the gate insulating film 150 is made of the thick organic film. Hence, the poor contact between the data line 120 and the transparent electrode layer 160 is decreased. Also, the problem of the gate pad 147 owing to the excess etching is decreased. Further, the data pad 123 can be reliably contacted as the cross-section of the data pad 123 has a step shape as the first contact opening 132 and the second contact opening 152 in a ladder shape. Also, the contact between the data pad 123 and an OLB (outer lead bonding) is improved when the organic film is remained.

As shown in FIG. 2, the transparent electrode layer 160 is formed on the gate insulating film 150. The transparent electrode layer 160 is connected through the second contact opening 151 with the connecting member 143, and includes a source electrode 161 partially contacted with the organic semiconductor layer 170, a drain electrode 163 separated from the source electrode 161 by interposing the organic semiconductor layer 170 therebetween, and a pixel electrode 169 positioned in the pixel region so as to be connected with the drain electrode 163.

As shown in FIG. 2, the transparent electrode layer 160 further includes a data pad contacting member 167 connected with the data pad 123, and a gate pad contacting member 165 connected through the third contact opening 153 with the gate pad 147. The transparent electrode layer 160 is made of a transparent conductive material such as ITO, IZO, etc. The source electrode 161 is physically and electrically connected through the second contact opening 151 with the data line 121 so as to receive an image signal. The drain electrode 163 is separated from the source electrode 161 so as to define a channel region A. The drain electrode 163 forms the TFT along with the source electrode 161. The TFT functions as a switching and driving device for controlling and driving an operation of each pixel electrode 169.

The organic semiconductor layer 170 is positioned on the gate electrode 145 formed in the gate insulating film 150. The organic semiconductor layer 170 covers the channel region A and exposed source and drain electrode 161 and 163. Organic semiconductor layer 170 may be formed of pentacene having five benzene rings linked to each other, perylenetetracarboxlic dianhidride (PTCDA), oligothiopene, polythiophene, polythienylenevinylene, etc., and also formed of one of the existing organic semiconductor materials. The organic TFT, the data pad, and the gate pad may be formed as described above. The FPD, such as a liquid crystal display device, an organic electroluminescent display device or an inorganic electroluminescent display, etc., including the organic TFT can be fabricated by a well-known method.

A passivation layer 180 (FIG. 2) is formed on the organic semiconductor layer 170. The passivation layer 180 is to prevent deterioration of the organic semiconductor layer 170. It is formed of an organic material such as PVA (Polyvinyl alcohol). A passivation layer 190 may be further formed on the second contact openings 151, 152 and the third contact opening 153, wherein the passivation layer 190 covers the organic semiconductor layer 170.

Hereafter, a method for manufacturing the FPD having the organic TFT will be described with reference to FIGS. 5A through 7E. FIGS. 5A through 5G are cross-sectional views sequentially showing a method for fabricating the TFT substrate according to the first embodiment of the present invention, FIGS. 6A through 6F are cross-sectional views sequentially showing a method for fabricating the data pad according to the first embodiment of the present invention, and FIGS. 7A through 7E are cross-sectional views sequentially showing a method for fabricating the gate pad according to the first embodiment of the present invention.

Figure 5A:
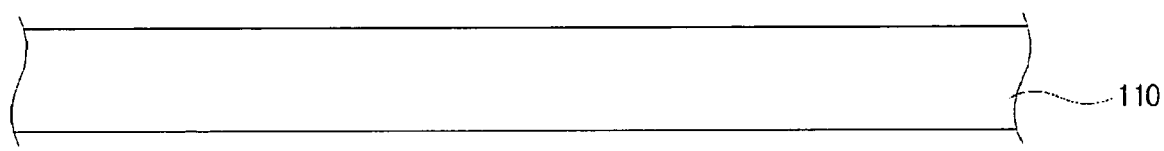
FIGS. 5A through 5G are cross-sectional views sequentially showing a method for fabricating the TFT substrate according to the first embodiment of the present invention.
Figure 5B:
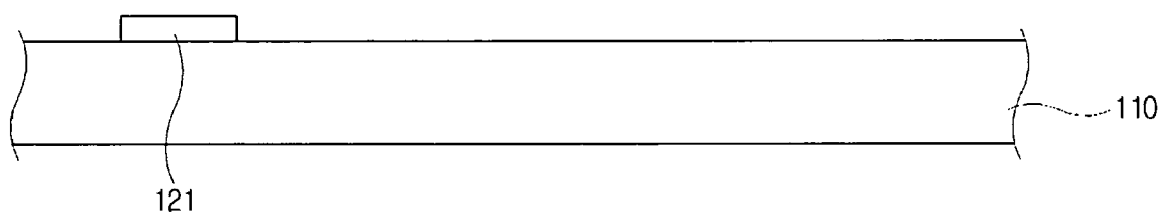
Figure 6A:
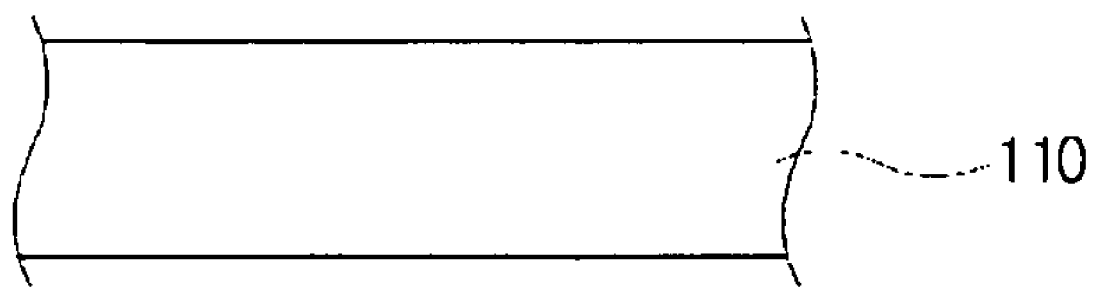
FIGS. 6A through 6F are cross-sectional views sequentially showing a method for fabricating the data pad according to the first embodiment of the present invention.
Figure 6B:
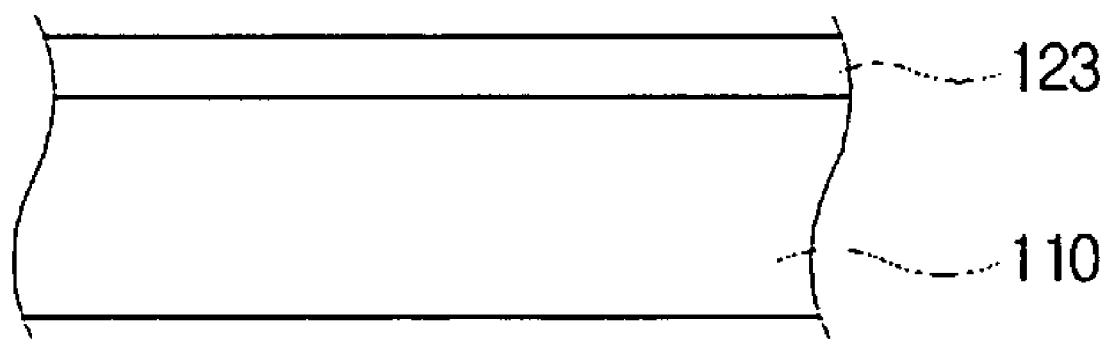
Figure 7A:
FIGS. 7A through 7E are cross-sectional views sequentially showing a method for fabricating the gate pad according to the first embodiment of the present invention.
Figure 7B:
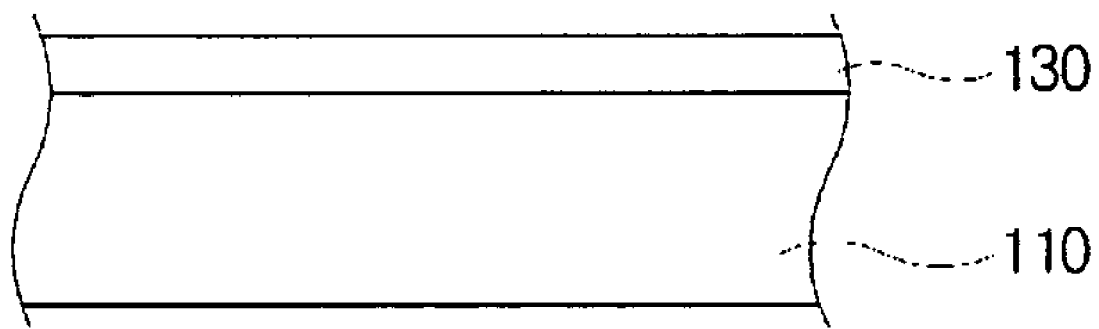

As shown in FIGS. 5A, 6A, and 7A, the insulating substrate 110 containing an insulation material such as glass, quartz, ceramic, plastic, etc., is prepared. Preferably, a plastic substrate is used in fabricating a flexible FPD. Then, as shown in FIGS. 5B and 6B, after a data line material is deposited on the insulating substrate 110 by using a sputtering method, etc., the data line 121 and the data pad 123 are formed by a photolithography process.

Figure 5C:
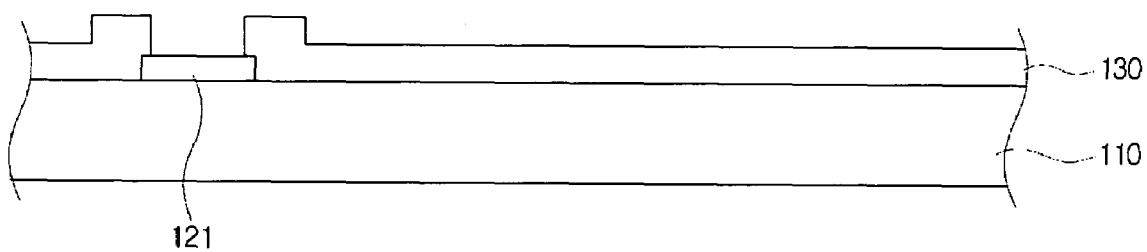
Figure 6C:
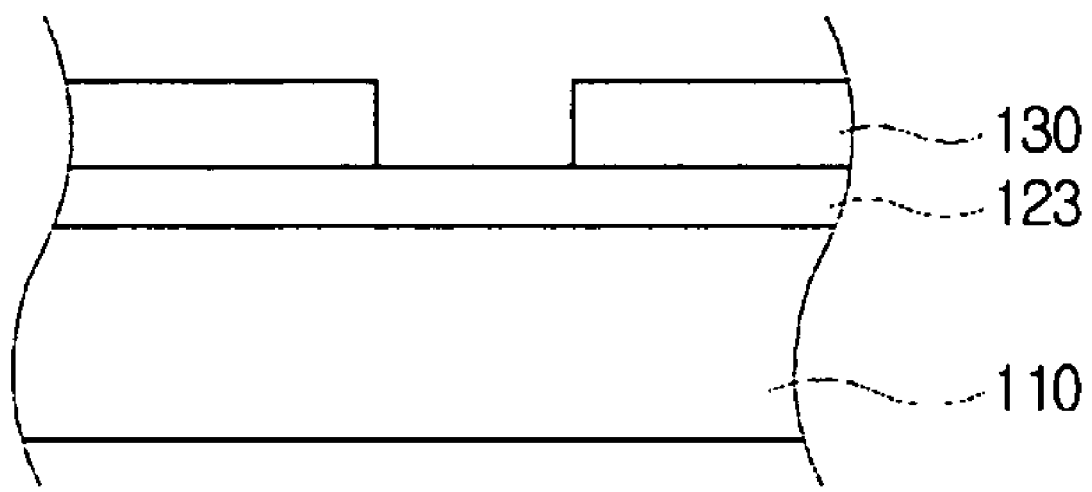
Figure 7C:
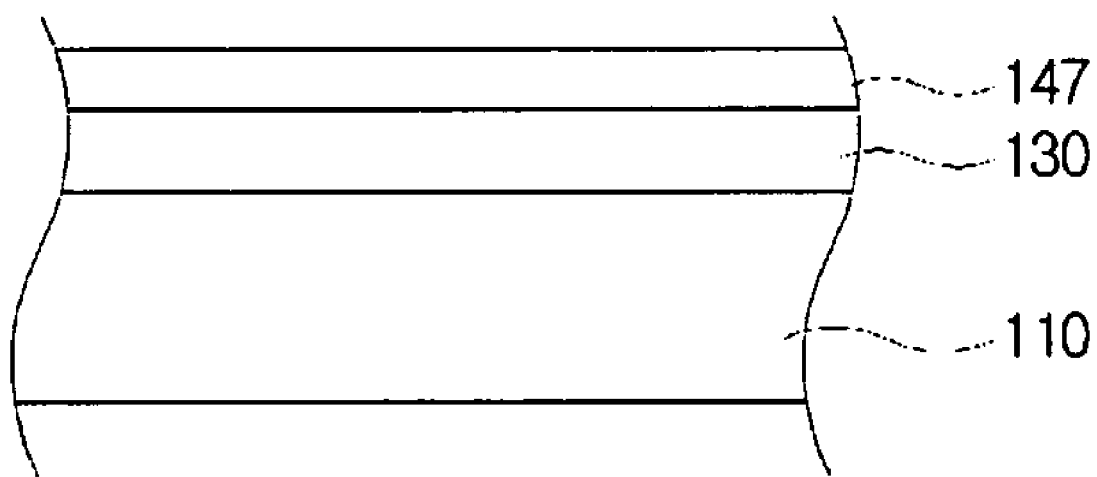

As shown in FIGS. 5C, 6C, and 7C, an interlayer insulating material comprising the inorganic material such as $SiN_x$, $SiO_x$, etc., or the organic material like BCB is coated on the insulating substrate 110 and the data line 120 to form the interlayer insulating film 130. If interlayer insulating material is an organic material, the interlayer insulating film 130 can be formed by a spin coating or slit coating method, etc. If interlayer insulating material is an inorganic material, it can be formed by a chemical vapor deposition (CVD), plasma enhanced chemical vapor deposition (EP-CVD), etc. As described above, the organic film as well as the inorganic film can be applied as the interlayer insulating film 130.

Figure 5D:
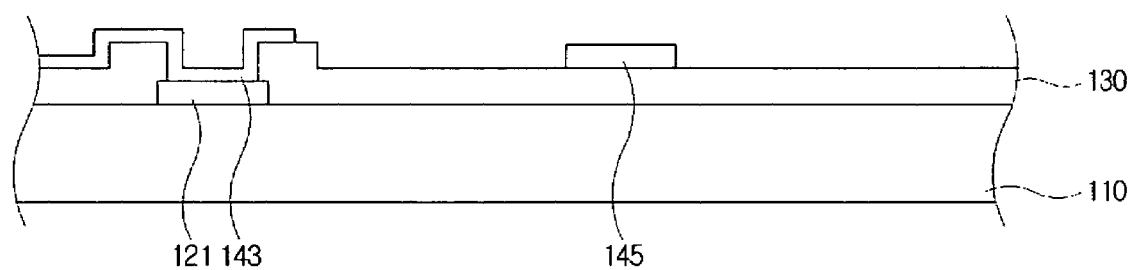
Figure 5E:
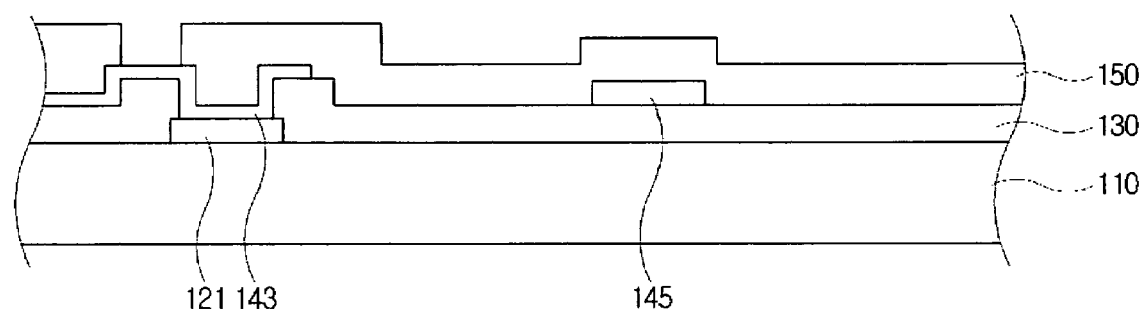
Figure 6D:
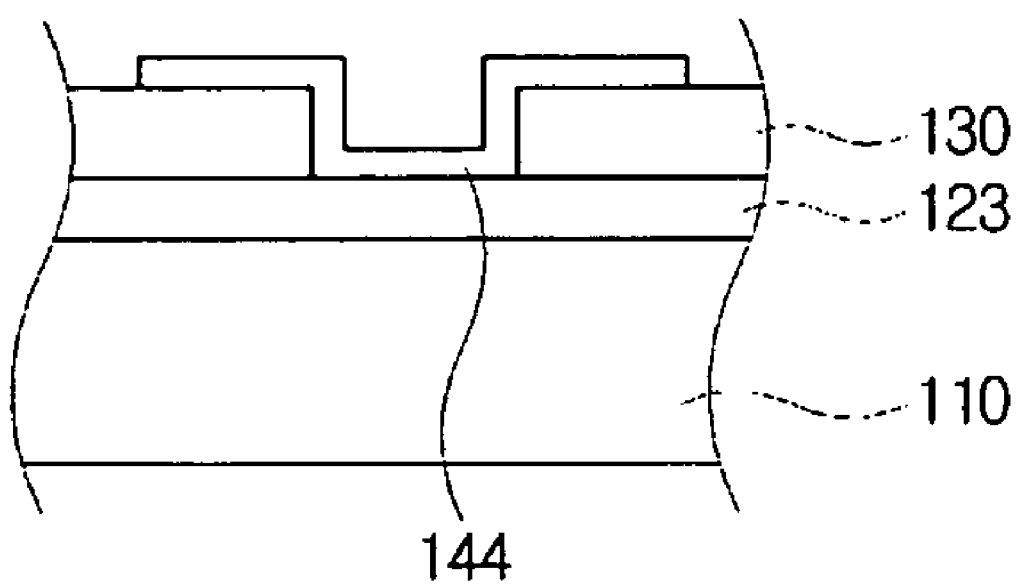
Figure 6E:
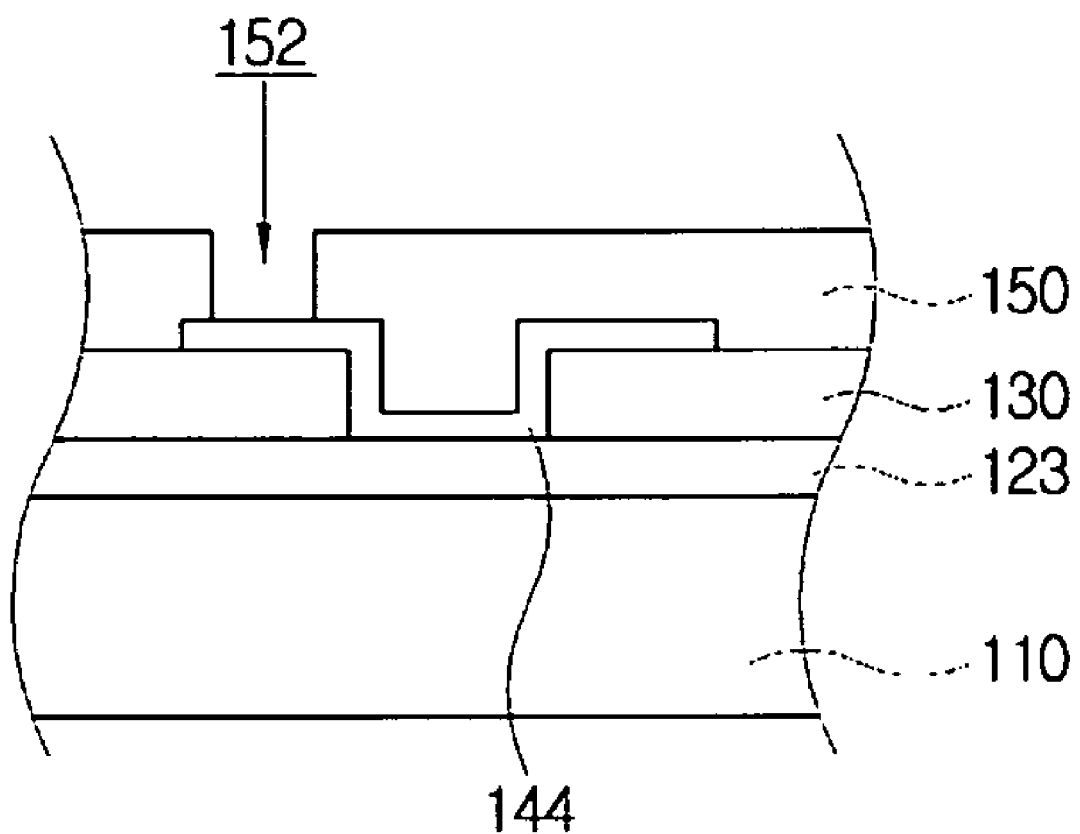
Figure 7D:
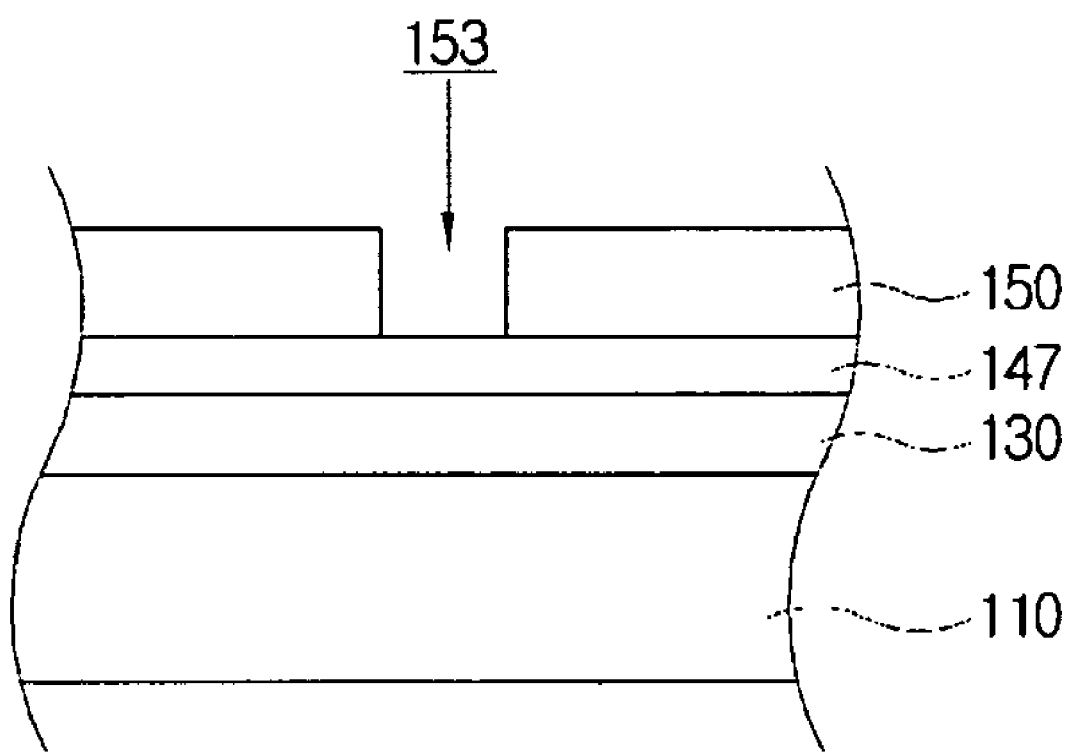

As shown in FIGS. 5C and 6c, the first contact openings 131, 132 are formed by an etching process using the photosensitive organic film, etc., as a shielding mask. Then, as shown in FIGS. 5D, 6D, and 7C, after a gate line material containing at least one of Al, Cr, Mo, Au, Pt, Pd, etc., is deposited on the interlayer insulating film 130 by a sputtering method etc., the gate line 141, the connecting members 143, 144, the gate electrode 145 and the gate pad 147 are formed by the photolithography process. Here, the connecting members 143, 144 come in contact with the data line 120 through the first contact openings 131, 132, and is located on the interlayer insulating film 130 formed at an edge of the data line 120. Sequentially, the thick gate insulating film 150 formed of an organic material such as BCB, etc., is formed on the gate line 140 and the interlayer insulating film 130 by the spin coating or slit coating method, etc. As shown in FIGS. 5E, 6E, and 7D, the second contact openings 151, 152 and the third contact opening 153 are formed in the gate insulating film 150 by the etching process using the photosensitive organic film as the shielding mask.

Figure 5F:
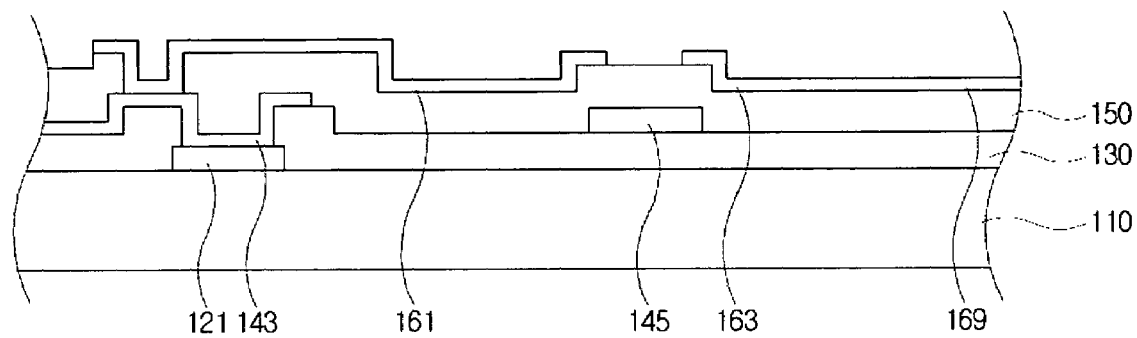
Figure 6F:
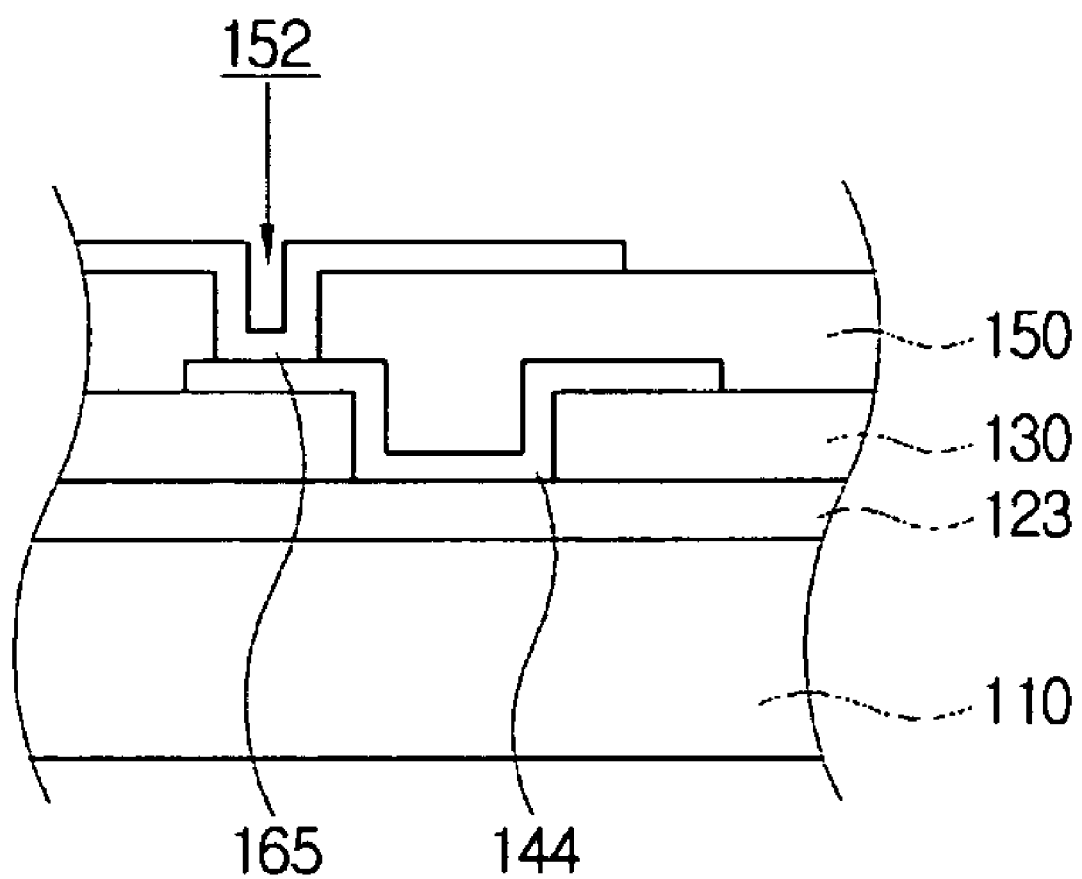
Figure 7E:
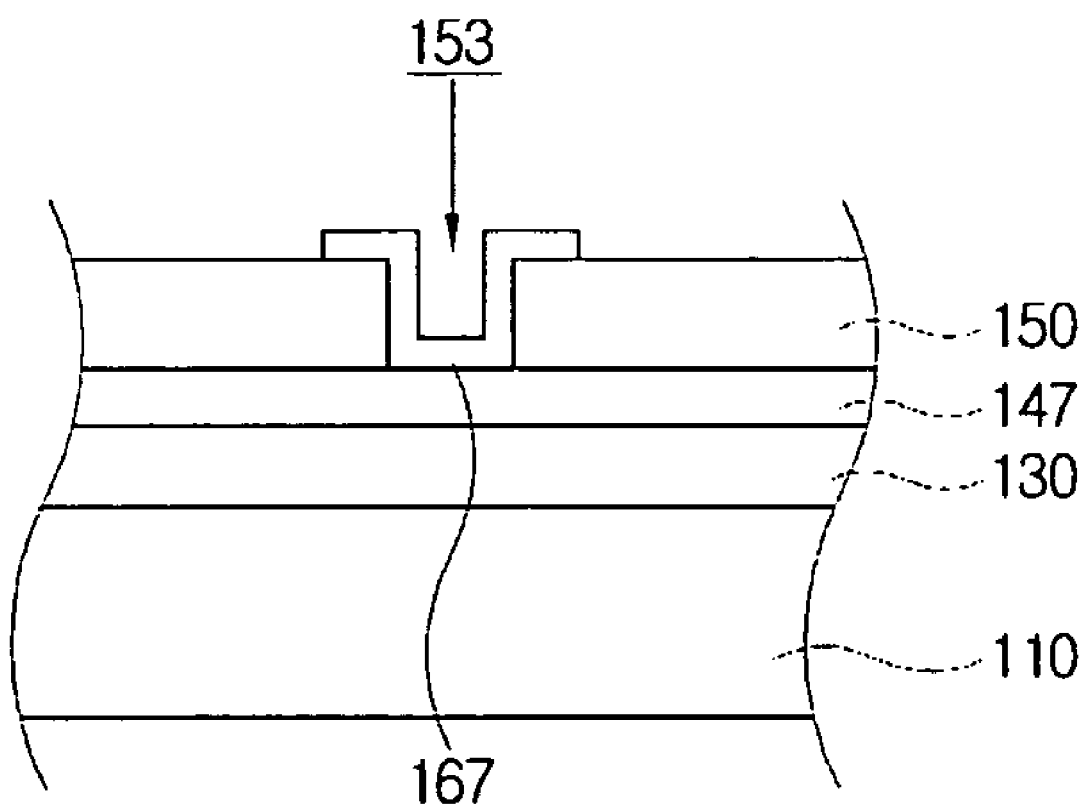

As shown in FIGS. 5F, 6F, and 7E, a transparent conductive metallic oxide material (transparent conductive material) such as ITO or IZO is coated on the gate insulating film 150 by the sputtering method or an evaporation method, and then the transparent electrode layer 160 is formed by using the photolithography process or the etching process. The transparent electrode layer 160 is connected through the second contact opening 151 with the connecting member 143, and includes the source electrode 161 which is at least partially contacted with the organic semiconductor layer 170, the drain electrode 163 separated from the source electrode 161 by interposing the organic semiconductor layer 170 therebetween, and the pixel electrode 169 positioned in the pixel region so as to be connected with the drain electrode 163. As shown in FIGS. 6F and 7E, the transparent electrode layer 160 further includes the data pad contacting member 165 connected with the data pad 123, and the gate pad contacting member 165 connected through the third contact opening 153 with the gate pad 147.

Figure 5G:
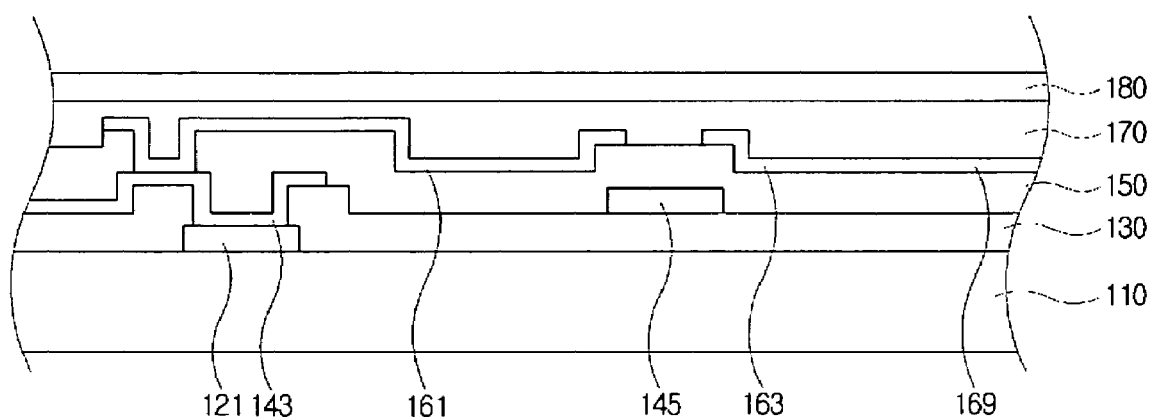

As shown in FIG. 5G, the organic semiconductor material is formed on the transparent electrode layer 160 by the evaporation method. In turn, the organic material or the photosensitive organic film is formed on the organic semiconductor material by the spin coating or slit coating method.

And as shown in FIG. 2, the organic semiconductor layer 170 and the passivation layer 180 in a upper part of the organic semiconductor layer 170 are formed. Here, the passivation layer 180 may be formed by the photolithography process and then the organic semiconductor layer 170 may be formed by the photolithography process. Alternatively, the organic semiconductor layer 170 and the passivation layer 180 may be formed by one photolithography process.

As shown in FIGS. 1 through 4, the organic passivation film 190 is further formed on the third contact opening 153 and the second contact openings 151, 152. The organic passivation film 190 covers the organic semiconductor layer 170. In case that the passivation film 190 is composed of the photosensitive organic film, the passivation film 190 can be formed by coating, exposing and developing processes. In case that the passivation film 190 is composed of the inorganic film like silicon nitride, it can be formed by deposition and photolithography processes. The organic TFT, the data pad, and the gate pad can be formed as described above. The FPD, such as a liquid crystal display device, an organic electroluminiscent display device or an inorganic electroluminiscent display, etc., including the organic TFT can be fabricated by a well-known method.

Hereafter, a second embodiment of the present invention will be described with reference to FIG. 8, where the same reference numerals will be used for elements identical to those of the first preferred embodiment and a detailed description of these elements will not be provided. In the first embodiment, the organic semiconductor layer 170 is formed by the evaporation and photolithography processes. However, the second embodiment employs an inkjet method.

Figure 8:
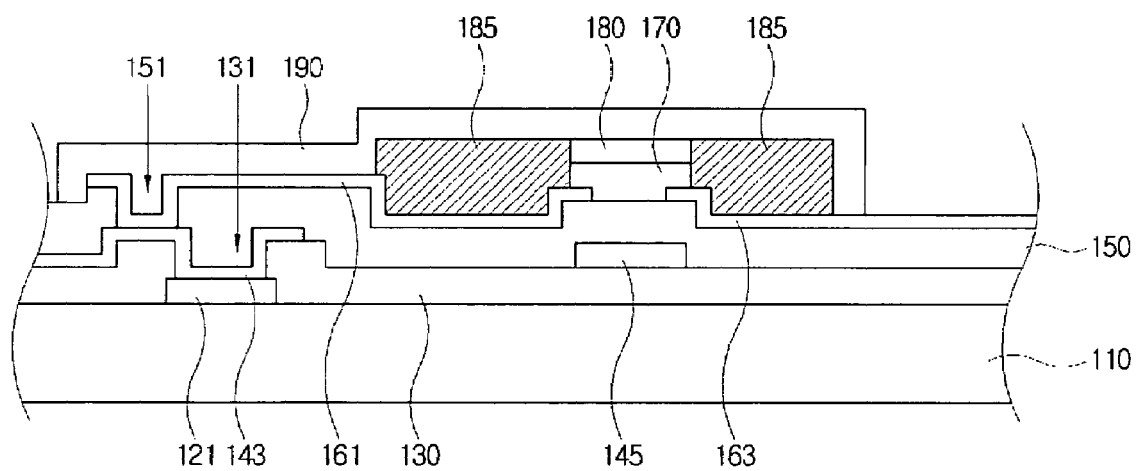
FIG. 8 is a cross-sectional view of the flat panel display according to a second embodiment of the present invention.

As shown in FIG. 8, a partition wall 185 is formed, wherein the partition wall 185 encloses the channel region A defined as the source electrode 161 and the drain electrode 163, and respectively exposes at least a part of the source electrode 161 and the drain electrode 163. The partition wall 185 is formed by exposing and developing process using the photosensitive organic material, and can be formed by a well-known method. As shown in FIG. 8, the organic semiconductor material is jetted at the channel region A by using a formed partition wall 185. The organic semiconductor material may be aqueous or oleaginous depending on a solvent to be used. The organic semiconductor material is treated by a solvent removing process to form the organic semiconductor layer 170. Then, a passivation layer solution is jetted on the organic semiconductor layer 170. The passivation layer solution may be also aqueous or oleaginous depending on a solvent to be used. The passivation layer solution is treated by a solvent removing process to form the passivation layer 180 having a flat surface.

The flat panel display according to the present invention can be used to a display device such as a liquid crystal display or an organic light emitting diode. The organic light emitting diode is a self-emitting device using organic materials which emit light by receiving an electronic signal. In the organic light emitting diode are layered an anode layer (a pixel electrode), a hole injection layer, a hole transporting layer, an emitting layer, an electron transporting layer, an electron injection layer, and a cathode layer (an opposite facing electrode). The drain electrode according to the present invention is electrically connected to the anode layer so that a data signal can be applied.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A flat panel display comprising:
an insulating substrate;
a data line formed on the insulating substrate;
an interlayer insulating film formed on the data line having a first contact opening exposing the data line;
a connecting member formed in a part of the first contact opening;
a gate insulating film formed on the connecting member having a second contact opening exposing the connecting member; and
an organic semiconductor layer formed on the gate insulating film,
wherein the second contact opening does not overlap the first contact opening.

2. The flat panel display according to claim 1, wherein the data line comprises a data line and a data pad.

3. The flat panel display according to claim 2, further comprising a transparent electrode layer formed on the gate insulating film, wherein the transparent electrode layer comprises a source electrode connected with the connecting member through the second contact opening and contacted to at least a part of the organic semiconductor layer, a drain electrode separated from the source electrode by the organic semiconductor layer, and a pixel electrode connected to the drain electrode.

4. The flat panel display according to claim 3, wherein the transparent electrode layer further comprises a data pad contact member connected to the data pad.

5. The flat panel display according to claim 1, wherein the gate insulating film is composed of organic material.

6. The flat panel display according to claim 1, wherein a height of the connecting member exposed by the second contact opening is greater than that of the connecting member formed on the first contact opening.

7. The flat panel display according to claim 1, further comprising a gate electrode formed on the same layer with the connecting member, wherein the gate electrode is located in a lower part of the organic semiconductor layer.

8. The flat panel display according to claim 3, further comprising a gate line formed to intersect with the data line to define a pixel area, and a gate pad which is provided in the end of the gate line, wherein the gate line and the gate pad are formed on the same layer with the connecting member.

9. The flat panel display according to claim 8, wherein a third contact opening to expose the gate pad is formed on the gate insulating film provided on the gate pad.

10. The flat panel display according to claim 9, wherein the transparent electrode layer further comprises a gate pad contact part connected to the gate pad through the third contact opening.

11. The flat panel display according to claim 3, wherein the transparent electrode layer is composed of one of ITO (Indium Tin Oxide) and IZO (Indium Zinc Oxide).

12. The flat panel display according to claim 1, further comprising a passivation layer formed on the organic semiconductor layer.

13. The flat panel display according to claim 9, wherein a thickness of the gate insulating film on which the second contact opening is formed is substantially the same as the thickness of the gate insulating film on which the third contact opening is formed.

* * * * *